(12) United States Patent
Jang

(10) Patent No.: US 7,376,041 B2
(45) Date of Patent: May 20, 2008

(54) SEMICONDUCTOR MEMORY DEVICE AND DATA READ AND WRITE METHOD OF THE SAME

(75) Inventor: Seong-Jin Jang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 107 days.

(21) Appl. No.: 11/024,272

(22) Filed: Dec. 27, 2004

(65) Prior Publication Data

US 2005/0174858 A1     Aug. 11, 2005

(30) Foreign Application Priority Data

Feb. 6, 2004   (KR) ...................... 10-2004-0008082

(51) Int. Cl.
*G11C 7/00*    (2006.01)
*G11C 7/10*    (2006.01)

(52) U.S. Cl. ............... 365/233; 365/219; 365/221; 365/189.05; 365/194; 365/238.5

(58) Field of Classification Search .......... 365/189.01, 365/189.05, 219, 233, 221, 238.5, 239, 220
See application file for complete search history.

(56) References Cited

U.S. PATENT DOCUMENTS

| | | | |
|---|---|---|---|
| 5,596,540 A * | 1/1997 | Diem et al. ................. | 365/221 |
| 6,229,758 B1 | 5/2001 | Agata | |
| 6,809,984 B2 * | 10/2004 | Nagano ................. | 365/230.05 |
| 6,865,135 B2 * | 3/2005 | Choi ........................... | 365/233 |
| 6,901,025 B2 * | 5/2005 | Ooishi ........................ | 365/233 |

FOREIGN PATENT DOCUMENTS

| | | |
|---|---|---|
| JP | 2001-176267 | 6/2001 |
| KR | 2001-0050549 | 6/2001 |

OTHER PUBLICATIONS

English language abstract of Korean Publication No. 2001-0050549.
English language abstract of Japanese Publication No. 2001-176267.

* cited by examiner

*Primary Examiner*—Huan Hoang
*Assistant Examiner*—Michael Weinberg
(74) *Attorney, Agent, or Firm*—Marger Johnson & McCollom, P.C.

(57) ABSTRACT

A semiconductor memory device includes a memory cell array to store data; a data input portion to output data to the memory cell array in response to a write control signal; a data output portion to output data from the memory cell array in response to a read control signal; a data I/O gate to transmit data outputted from the data input portion to the memory cell array in response to the write control signal, and transmitting data outputted from the memory cell array to the data output portion in response to the read control signal; and a data I/O controller to generate the read control signal and the write control signal having a smaller minimum cycle time than a minimum cycle time of the read control signal. The semiconductor memory device has an improved operation performance compared to one having a low operation frequency within an operable frequency range.

18 Claims, 4 Drawing Sheets

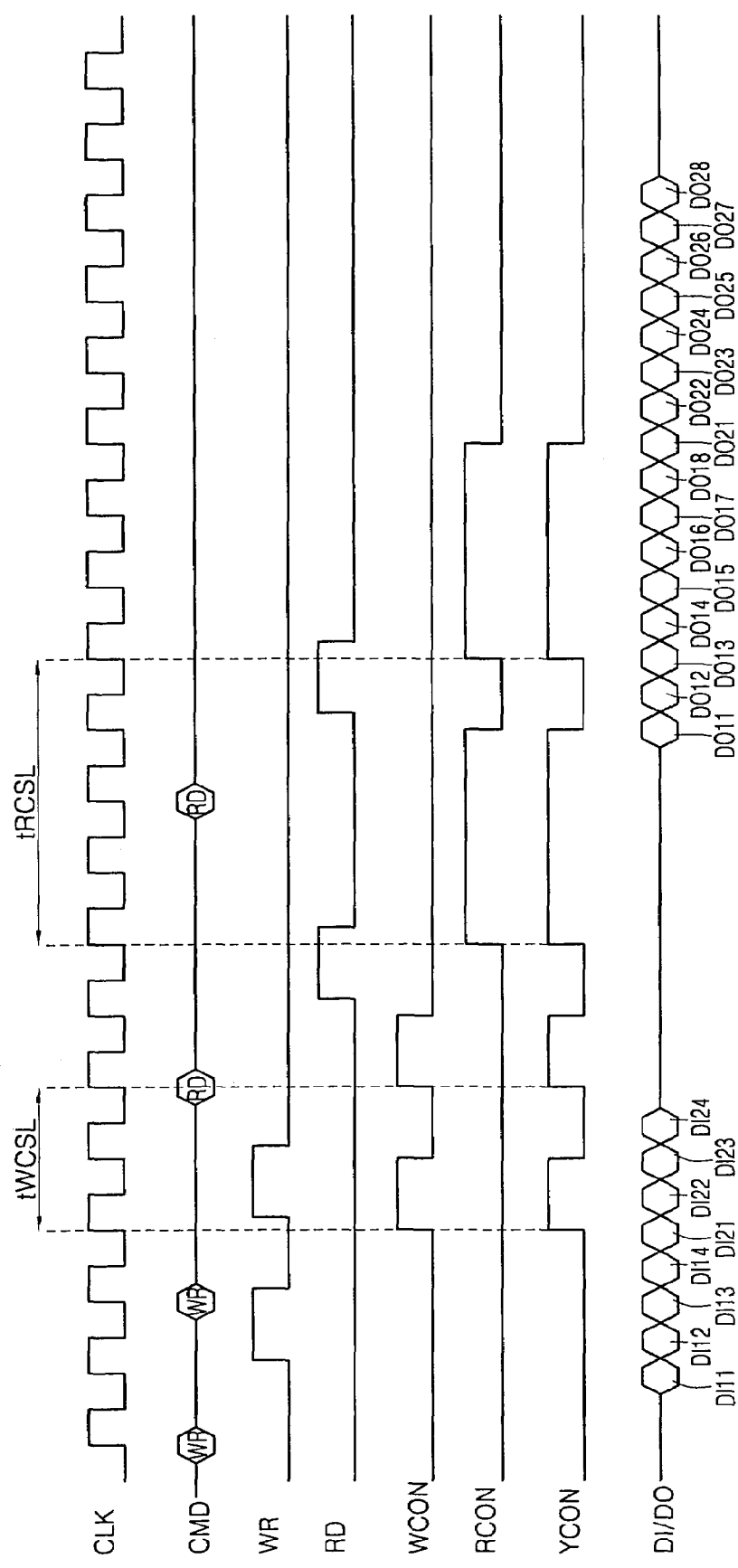

SEMICONDUCTOR MEMORY DEVICE AND DATA READ AND WRITE METHOD OF THE SAME

CROSS-REFERENCE TO RELATED APPLICATION

This application claims the benefit of Korean Patent Application No. 2004-8082, filed Feb. 6, 2004, the disclosure of which is hereby incorporated herein by reference in its entirety.

BACKGROUND OF THE INVENTION

1. Field of the Invention

The disclosure relates to a semiconductor memory device and, more particularly, to a semiconductor memory device that can perform a write operation faster than a read operation, and a data read and write method of the same.

2. Description of the Related Art

A conventional double data rate (DDR) semiconductor memory device is divided into three types; DDR1, DDR2, and DDR3, each with a maximum operating frequency of 400 MHz, 800 MHz, and 1 GHz, respectively.

In the conventional DDR semiconductor memory device, during a write operation and a read operation, a minimum column selecting cycle time is set to one clock cycle for DDR1, two clock cycles for DDR2, and four clock cycles for DDR3. Here, the minimum column selecting cycle time is referred to as a minimum cycle time that a continuous write operation or a continuous read operation can be applied.

In general, the DDR2 semiconductor memory device is faster in operation speed than the DDR1 semiconductor memory device, and the DDR3 semiconductor memory device is faster in operation speed than the DDR2 semiconductor memory device. However, there is a problem in that the DDR3 semiconductor memory device is slower in operation speed than the DDR2 semiconductor memory device during a low frequency operation within an operable frequency range of the DDR3 semiconductor memory device. Similarly, the DDR2 semiconductor memory device may be slower in operation speed than the DDR1 semiconductor memory device.

For example, the operable frequency range of the DDR3 semiconductor memory device is larger than 800 MHz and equal to or lower than 1 GHz. When a minimum column selecting cycle time is equally set to four clock cycles at a frequency of 850 MHz during a write operation and a read operation of the DDR3 semiconductor memory device, an operation performance of the DDR3 semiconductor memory device is deteriorated compared to the DDR2 semiconductor memory device, because the clock frequency is in the lower range within the operating frequency of a DDR3 memory of 800 MHz to 1 GHz.

Meanwhile, a read operation has a lower frequency margin than that of a write operation. Therefore, there is a need to improve an operation performance of the DDR3 semiconductor memory device by maintaining a minimum column selecting cycle time to four clock cycles during a read operation and by making a minimum column selecting cycle time smaller than four clock cycles during a write operation, at a low frequency within an operable frequency range.

Similarly, there is a need to improve an operation performance of the DDR2 semiconductor memory device by maintaining a minimum column selecting cycle time to two clock cycles during a read operation and by making a minimum column selecting cycle time smaller than two clock cycles during a write operation.

SUMMARY OF THE INVENTION

It is an object of the disclosure to provide a semiconductor memory device that can improve an operation performance by making a minimum column selecting cycle time for a write operation smaller than a minimum column selecting cycle time for a read operation.

It is another object of the disclosure to provide a data write and read method of a semiconductor memory device that can improve an operation performance by making a minimum column selecting cycle time for a write operation smaller than a minimum column selecting cycle time for a read operation.

In order to achieve the above objects, the disclosure provides a semiconductor memory device, comprising: a memory cell array for storing data; a data input portion for outputting data to the memory cell array in response to a write control signal; a data output portion to output data from the memory cell array in response to a read control signal; a data I/O gate for transmitting data outputted from the data input portion to the memory cell array in response to the write control signal, and transmitting data outputted from the memory cell array to the data output portion in response to the read control signal; and a data I/O controller for generating the read control signal and the write control signal having a smaller minimum cycle time than a minimum cycle time of the read control signal.

The data I/O controller combines the write control signal and the read control signal to generate a column selecting control signal.

The data I/O gate transmits data outputted from the data input portion to the memory cell array in response to the column selecting control signal, and outputs data outputted from the memory cell array to the data output portion.

The semiconductor memory device further comprises a column decoder for controlling a minimum column selecting cycle time of the column selecting signal in response to the column selecting control signal.

Data which are serially inputted from an external portion is smaller in bit number than data which are serially outputted to an external portion.

The data input portion converts the serially inputted data to parallel data, and outputs the parallel data to the memory cell array in response to the write control signal. The data output portion converts data which are outputted in parallel from the memory cell array to serial data, and outputs the converted serial data in response to the read control signal.

The converted parallel data outputted from the data input portion is smaller in bit number than data which are outputted in parallel from the memory cell array.

The semiconductor memory device operates at a low frequency range within an operable frequency range.

A minimum cycle time of the read control signal is an n (n is an integer equal to or larger than 2) clock cycle, and a minimum cycle time of the write control signal is a n/2 clock cycle.

The disclosure further provides a data write and read method of a semiconductor memory device, comprising: (a) generating a read control signal and a write control signal having a smaller minimum cycle time than the read control signal; and (b) transmitting input data to a memory cell array in response to the write control signal, and outputting data outputted from the memory cell array as output data in response to the read control signal.

At the step (a), the write control signal and the read control signal are combined to generate a column selecting control signal.

At the step (b), the input data are transmitted to the memory cell array, and data outputted from the memory cell array are outputted in response to the column selecting control signal.

At the step (b), a column address is decoded to generate a column selecting signal, and a minimum column selecting cycle time of the column selecting signal is controlled in response to the column selecting control signal.

At the step (b), data which are serially inputted from an external portion is smaller in bit number than data which are serially outputted to an external portion, and data which are serially inputted from an external portion is smaller in bit number than data which are serially outputted to an external portion.

The step (b) further comprises converting data which are serially inputted from an external portion to parallel data, and outputting the converted parallel data as the input data in response to the write control signal; and converting data which are outputted in parallel to serial data, and outputting the converted serial data serially in response to the read control signal.

BRIEF DESCRIPTION OF THE DRAWINGS

The above and other features and advantages of the disclosure will become more apparent to those of ordinary skill in the art by describing in detail preferred embodiments thereof with reference to the attached drawings.

FIG. 4 is a timing diagram illustrating a data write and read operation.

DETAILED DESCRIPTION OF THE INVENTION

The disclosure will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
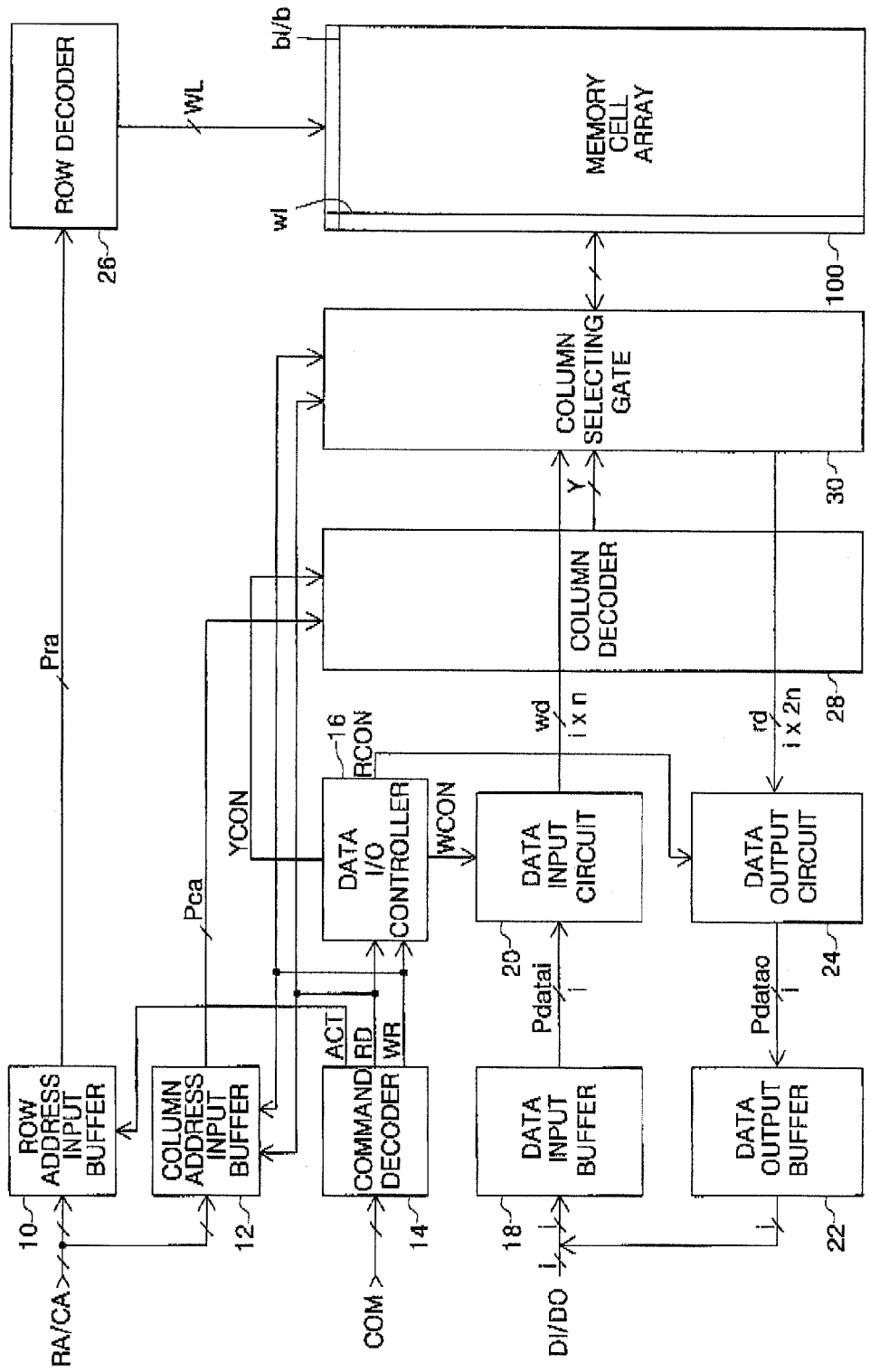
FIG. 1 is a block diagram illustrating a semiconductor memory device according to an embodiment of the invention.

FIG. 1 is a block diagram illustrating a semiconductor memory device according to an embodiment of the present invention. The semiconductor memory device of FIG. 1 includes a memory cell array 100, a row address input buffer 10, a column address input buffer 12, a command decoder 14, a data I/O controller 16, a data input buffer 18, a data input circuit 20, a data output buffer 22, a data output circuit 24, a row decoder 26, a column decoder 28, and a column selecting gate 30.

In FIG. 1, wl denotes one respective word line, and bl/b denotes one respective bit line pair.

Function of the components of the semiconductor memory device of FIG. 1 is explained below.

The row address input buffer 10 buffers a row address RA applied from an external portion to generate the buffered row address Pra in response to an active command ACT. The column address input buffer 12 buffers a column address CA applied from an external portion to generate a buffered column address Pca in response to a read command RD or a write command WR. The command decoder 14 decodes a command COM to generate an active command ACT, the read command RD, and the write command WR. The data I/O controller 16 generates a read control signal RCON in response to the read command RD, generates a write control signal WCON in response to the write command WR, and generates a column selecting control signal YCON in response to the read and write command RD and WR. The data input buffer 18 buffers an i-number of data inputted from an external portion to generate an i-number of buffered data Pdatai. The data input circuit 20 converts the i-number of buffered n-bit data Pdatai that are serially inputted to parallel data, and generates an i-number of n-bit write data wd in response to the write control signal WCON. The data output buffer 22 buffers an i-number of output data Pdatao to generate an i-number of data. The data output circuit 24 converts an i-number of 2n-bit read data rd which are inputted in parallel to serial data and generates an i-number of output data Pdatao in response to the read control signal RCON. The row decoder 26 decodes the buffered row address Pra to generate a word line selecting signal WL for selecting a word line wl. The column decoder 28 decodes the buffered column address Pca and controls a minimum selecting cycle time to generate a column selecting signal Y for selecting a bit line pair bl/b in response to the column selecting control signal YCON. The column selecting gate 30 transmits an i-number of n-bit write data wd to n×i-number of bit line pairs bl/b in response to the write command WR and the column selecting signal Y, and transmits data outputted from the 2n×i-number of bit line pairs bl/b as the i-number of 2n-bit read data rd.

That is, the semiconductor memory device of the disclosure is configured such that the column decoder 28 controls a minimum column selecting cycle time of the column selecting signal Y to be longer during a read operation than during a write operation in response to the column selecting control signal YCON outputted from the data I/O controller 16. The data I/O controller 16 controls a minimum cycle time of the column selecting control signal YCON generated during a write operation to be smaller than that generated during a read operation. Further, the data I/O controller 16 controls a minimum cycle time of a write control signal WCON generated during a write operation to be smaller than that of the read control signal RCON generated during the read operation. Here, a minimum cycle time is referred to as a cycle time of the write control signal WCON and the read control signal RCON generated when a continuous read command or a continuous write command is applied.

Figure 2:
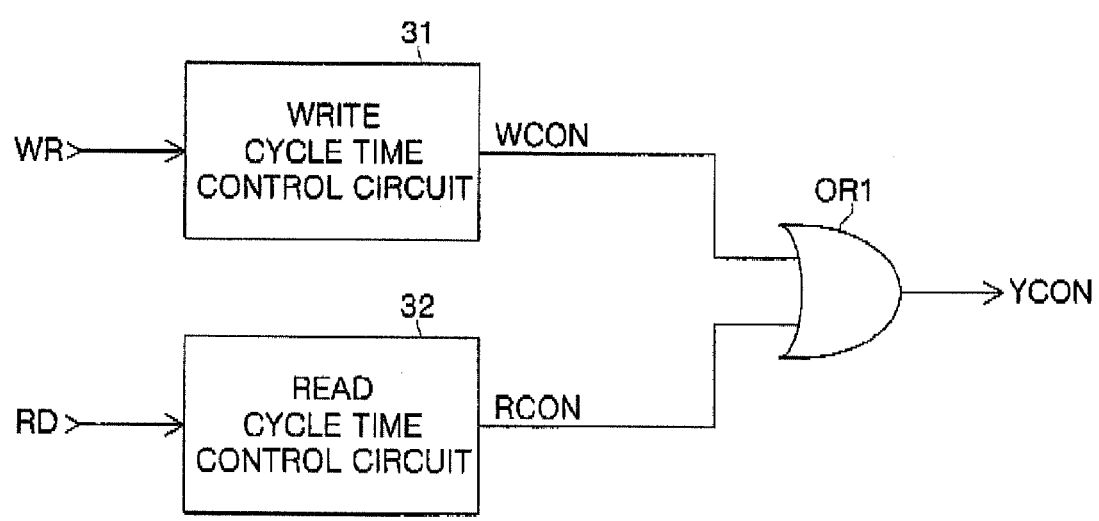
FIG. 2 is a block diagram illustrating an embodiment of a data I/O controller.

FIG. 2 is a block diagram illustrating an embodiment of the data I/O controller 16 of the disclosure. The data I/O controller of FIG. 2 includes a write cycle time control circuit 31, a read cycle time control circuit 32, and an OR gate OR1.

Function of the components of the data I/O controller of FIG. 2 is explained below.

The write cycle time control circuit 31 generates a write control signal WCON in response to a write command WR. The read cycle time control circuit 32 generates a read control signal RCON having a greater minimum cycle time than a minimum cycle time of the write control signal WCON in response to a read command RD. The OR gate OR1 OR's a write control signal WCON and a read control signal RCON to generate a column selecting control signal YCON.

Figure 3:
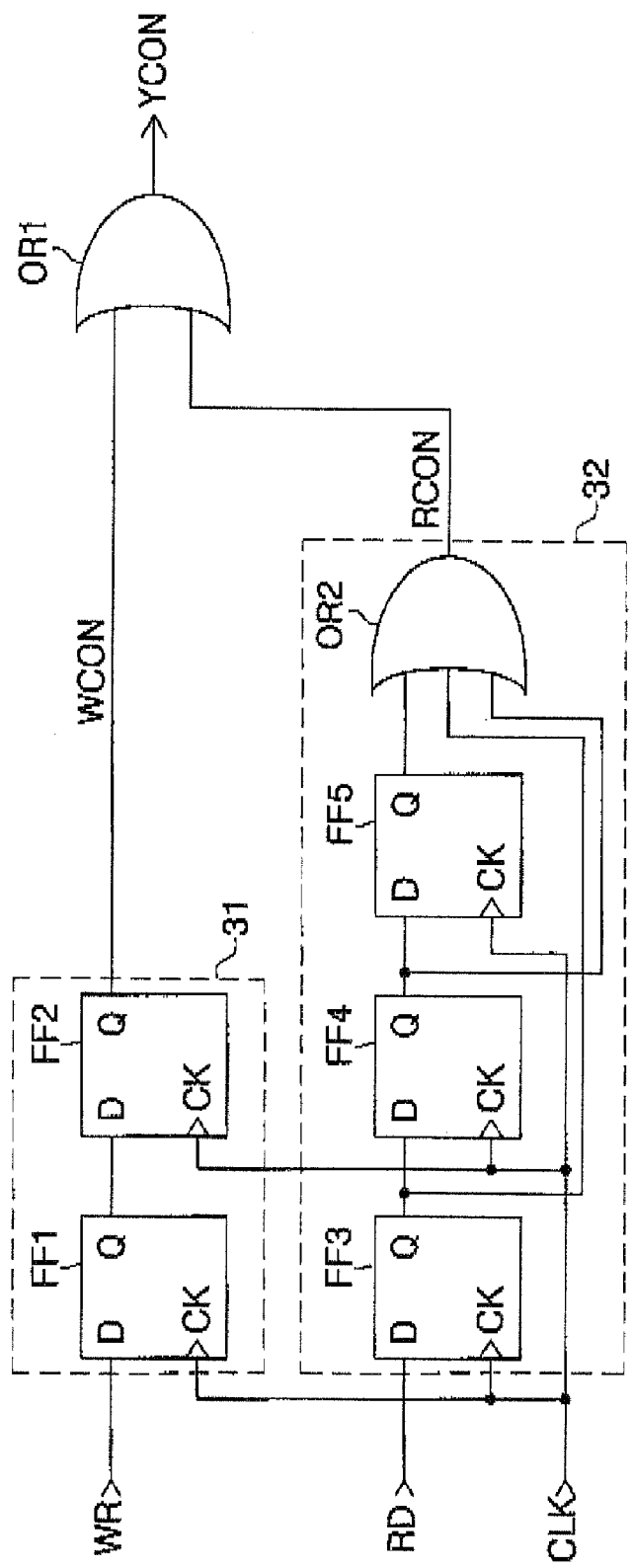
FIG. 3 is a detailed view illustrating the data I/O controller.

FIG. 3 is a detailed view illustrating an embodiment of the data I/O controller 16. The write cycle time control circuit 31 includes flip-flops FF1 and FF2, and the read cycle time control circuit 32 includes flip-flops FF3 to FF5 and an OR gate OR2.

Function of the components of the data I/O controller of FIG. 3 is explained below.

The flip-flop FF1 outputs a write command WR prior to a rising edge of a clock signal CLK. The flip-flop FF2 outputs an output signal of the flip-flop FF1 prior to a rising edge of a clock signal CLK as a write control signal WCON. The flip-flop FF3 outputs a read command RD prior to a rising edge of a clock signal CLK. The flip-flop FF4 outputs an output signal of the flip-flop FF3 prior to a rising edge of a clock signal CLK. The flip-flop FF5 outputs an output signal of the flip-flop FF4 prior to a rising edge of a clock signal CLK. The OR gate OR2 ORs output signals of the flip-flops FF3 to FF5 to generate a read control signal RCON. The OR gate OR1 ORs a write control signal WCON and a read control signal RCON to generate a column selecting control signal YCON.

FIG. 4 is a timing diagram illustrating an embodiment of a data write and read operation of the semiconductor memory device of the disclosure. In FIG. 4, one word line of the memory cell array 100 is selected in response to a row address RA inputted in response to an active command. A write command WR and a read command RD are continuously inputted. A write CAS latency is 1, and a read CAS latency is 5. Also, it is assumed that when a command COM for generating a write command WR and a read command RD are applied at a rising edge of a clock signal CLK, the command decoder 14 delays a predetermined time period before generating a write command WR and a read command RD. Further, data DI/DO are inputted and outputted through one pin or pad.

When a command COM for a first write operation and a column address CA are applied, and after a predetermined time period a write command WR is applied, the write cycle time control circuit 31 of FIG. 3 generates a write control signal WCON and a column selecting control signal YCON which are pulse signals having twice the pulse width of a clock signal CLK when a 3 clock cycle is lapsed after the command COM is applied. The column address input buffer 12 buffers a column address CA to generate a buffered column address Pca. When one clock cycle is lapsed after a command COM for a first write operation is applied, 4-bit input data DI11 to DI14 are serially inputted, as shown in FIG. 4. The data input buffer 18 sequentially buffers the 4-bit input data DI11 to DI14 to output buffered input data Pdatai. The data input circuit 20 converts the 4-bit buffered input data Pdatai, which are sequentially inputted to become parallel data, and generates 4-bit parallel write data wd in response to a write control signal WCON. The column decoder 28 decodes a buffered column address Pca to generate a column selecting signal Y, and controls a minimum column selecting cycle time tWCSL of a column selecting signal Y in response to a column selecting control signal YCON. The column selecting gate 30 transmits 4-bit parallel write data wd to selected bit line pairs b1/b of the memory cell array 100 in response to a column selecting signal Y.

If a command for a second write operation is applied when a 2 clock cycle is lapsed after a command COM for a first write operation is applied, as shown in FIG. 4, the same operation as during the first write operation is performed, so that 4-bit input data DI21 to DI24 are written to the memory cell array 100.

As shown in FIG. 4, the semiconductor memory device of the disclosure can set a minimum column selecting cycle time tWCSL for a write operation to a two clock cycle, and thus a burst length is 4.

When a command COM for a first read operation and a column address CA are applied and after a predetermined time period a read command RD is generated, the read cycle time control circuit 32 of FIG. 3 generates a read control signal RCON and a column selecting control signal YCON, which are pulse signals having six times the pulse width of a clock signal CLK when a 2 clock cycle is lapsed after the command COM is applied. The column address input buffer 12 buffers a column address CA to generate a buffered column address Pca. The column decoder 28 decodes a buffered column address Pca to generate a column selecting signal Y, and controls a minimum column selecting cycle time of a column selecting signal Y in response to a column selecting control signal YCON. The column selecting gate 30 transmits 8-bit parallel read data to selected bit line pairs b1/b of the memory cell array 100 as read data rd in response to a column selecting signal Y. The data output circuit 24 receives 8-bit read data rd which are outputted in parallel in response to a read control signal RCON, and converts the 8-bit read data rd to serial output data Pdatao. The data output buffer 22 buffers output data Pdatao to sequentially generate buffered output data as output data DO11 to DO18 when a 5 clock cycle is lapsed after a command COM for a first read operation is applied, as shown in FIG. 4.

If a command COM for a second read operation is applied when a 4 clock cycle is lapsed after a command COM for a first read operation is applied, the same operation as during a first read operation is performed, so that 8-bit read data rd outputted from the memory cell array are sequentially outputted as output data DO21 to DO28, as shown in FIG. 4.

As shown in FIG. 4, the semiconductor memory device of the disclosure sets a minimum column selecting cycle time tRCSL for a read operation to a 4 clock cycle, and thus a burst length is 8.

The semiconductor memory device of the disclosure sets a minimum column selecting cycle time tRCSL for a read operation to a 4 clock cycle and a minimum column selecting cycle time tWCSL to a 2 clock cycle for a write operation, thereby resolving a problem resulting from a deteriorated operation performance.

The above-described embodiment of the disclosure describes that a minimum column selecting cycle time tWCSL for a write operation is set to half the number of clock cycles of a minimum column selecting cycle time tRCSL for a read operation, but it does not matter when a minimum column selecting cycle time tWCSL for a write operation is set to be smaller than a minimum column selecting cycle time tRCSL for a read operation.

Also, it is described that a column selecting control signal YCON for a write operation has twice the pulse width of a clock signal CLK. But, it does not matter when a pulse width of a column selecting control signal YCON is set to be smaller than a pulse width of a minimum column selecting cycle time tWCSL. Similarly, it is described that a column selecting control signal YCON for a read operation has six times the pulse width of a clock signal CLK. But, it does not matter when a pulse width of a column selecting control signal YCON is set to be smaller than a pulse width of a minimum column selecting cycle time tRCSL.

Furthermore, the above-described embodiment of the disclosure is described focusing on a double data rate semiconductor memory device but can be also applied to semiconductor memory devices which operate at a single data rate or a quad data rate.

As described herein before, the semiconductor memory device and the data write and read method according to the disclosure have an improved operation performance compared to a semiconductor memory device having a low operation frequency, at a low frequency within an operable frequency range.

What is claimed is:

1. A double data rate (DDR) semiconductor memory device, comprising:
    a memory cell array to store data;
    a data input portion to serially receive an i-number of n-bit write data from i input lines and to convert the i-number of n-bit write data to parallel data, and to output the parallel i-number of n-bit write data to the memory cell array in response to a write control signal;
    a data output portion to convert to serial data an i-number of 2n-bit read data that are inputted in parallel from the memory cell array to i output lines and to generate an i-number of 2n-bit output data in response to a read control signal;
    a data I/O gate to transmit the parallel i-number of n-bit write data outputted from the data input portion to n times i-number of bit line pairs of the memory cell array in response to the write control signal, and to transmit the i-number of 2n-bit read data outputted from 2n times i-number of bit line pairs of the memory cell array to the data output portion in response to the read control signal; and
    a data I/O controller to generate the read control signal, and to generate the write control signal having a smaller minimum cycle time than a minimum cycle time of the read control signal.

2. The device of claim 1, wherein the data I/O controller combines the write control signal and the read control signal to generate a column selecting control signal.

3. The device of claim 2, wherein the data I/O gate transmits the parallel i-number of n-bit write data outputted from the data input portion to the memory cell array in response to the column selecting control signal, and outputs the i-number of 2n-bit read data outputted from the memory cell array to the data output portion.

4. The device of claim 3, further comprising, a column decoder to control a minimum column selecting cycle time of the column selecting signal in response to the column selecting control signal.

5. The device of claim 3, wherein the i-number of n-bit write data that is serially inputted from an external portion is smaller in bit number than the i-number of 2n-bit output data that is serially outputted to an external portion.

6. The device of claim 1, wherein the converted parallel i-number of n-bit write data outputted from the data input portion is smaller in bit number than the i-number of 2n-bit read data that are outputted in parallel from the memory cell array.

7. The device of claim 1, wherein the semiconductor memory device operates at a low frequency range within an operable frequency range.

8. The device of claim 1, wherein a minimum cycle time of the read control signal is x clock cycles, where x is an integer equal to or greater than 2, and a minimum cycle time of the write control signal is x/2 clock cycles.

9. A data write and read method of a double data rate (DDR) semiconductor memory device having i input lines and i output lines, comprising:
    generating a read control signal and generating a write control signal having a smaller minimum cycle time than the read control signal; and
    transmitting parallel i-number of n-bit input data to a memory cell array in response to the write control signal, and outputting parallel i-number of 2n-bit read data outputted from 2n times i-number of bit line pairs of the memory cell array as output data in response to the read control signal.

10. The method of claim 9, wherein generating further comprises, combining the write control signal and the read control signal to generate a column selecting control signal.

11. The method of claim 10, wherein transmitting further comprises, transmitting the parallel i-number of n-bit input data to the memory cell array, and the i-number of 2n-bit read data outputted from the memory cell array are outputted in response to the column selecting control signal.

12. The method of claim 11, wherein transmitting further comprises, decoding a column address to generate a column selecting signal, and a minimum column selecting cycle time of the column selecting signal is controlled in response to the column selecting control signal.

13. The method of claim 12, wherein transmitting further comprises serially inputting data from an external portion that is smaller in bit number than that of data that are serially outputted to an external portion.

14. The method of claim 13, wherein transmitting further comprises,
    converting data which are serially inputted from an external portion to parallel data, and outputting the converted parallel data as the input data in response to the write control signal; and
    converting data which are outputted in parallel to serial data, and outputting the converted serial data serially in response to the read control signal.

15. The method of claim 9, wherein transmitting further comprises operating the semiconductor memory device at a low frequency range within an operable frequency range.

16. The method of claim 9, wherein having a minimum cycle time of the read control signal further comprises x clock cycles, where x is an integer equal to or greater than 2, and a minimum cycle time of the write control signal is x/2 clock cycles.

17. The device of claim 1, wherein the data I/O controller comprises:
    a first group of time-delay circuit elements that outputs the write control signal;
    a second group of time-delay circuit elements configured to produce a greater time delay than that of the first group; and
    a logic gate that receives time-delayed signals from the time-delay circuit elements of the second group, and outputs the read control signal.

18. The device of claim 1, wherein the read control signal is generated by logically combining time-delayed signals of a read command.

* * * * *

UNITED STATES PATENT AND TRADEMARK OFFICE
CERTIFICATE OF CORRECTION

PATENT NO. : 7,376,041 B2 Page 1 of 1
APPLICATION NO. : 11/024272
DATED : May 20, 2008
INVENTOR(S) : Seong-Jin Jang It is certified that error appears in the above-identified patent and that said Letters Patent is hereby corrected as shown below:

Column 1, line 25, the word "GHz." should read -- GHz, --;
Column 3, line 64, the word "bl/b" should read -- b1/b --.

Signed and Sealed this

Sixteenth Day of December, 2008

JON W. DUDAS
*Director of the United States Patent and Trademark Office*